(12) United States Patent
Koyanagi

(10) Patent No.: US 6,486,813 B1
(45) Date of Patent: Nov. 26, 2002

(54) OVERSAMPLING CIRCUIT DIGITAL/ ANALOG CONVERTER

(75) Inventor: Yukio Koyanagi, Saitama (JP)

(73) Assignee: Yasue Sakai, Urawa (JP)

( * ) Notice: Subject to any disclaimer, the term of this patent is extended or adjusted under 35 U.S.C. 154(b) by 0 days.

(21) Appl. No.: 09/890,518

(22) PCT Filed: Dec. 15, 2000

(86) PCT No.: PCT/JP00/08900

§ 371 (c)(1),
(2), (4) Date: Jul. 31, 2001

(87) PCT Pub. No.: WO01/45267

PCT Pub. Date: Jun. 21, 2001

(30) Foreign Application Priority Data

Dec. 17, 1999 (JP) .............................. 11-359893

(51) Int. Cl.[7] .............................. H03M 1/66; H03M 1/36
(52) U.S. Cl. ......................... 341/144; 341/159; 341/143
(58) Field of Search ................................ 341/143, 144, 341/159, 128, 129

(56) References Cited

U.S. PATENT DOCUMENTS 4,167,731 A  9/1979 Eggermont .................. 341/76
4,862,170 A * 8/1989 Hashimoto et al. ......... 341/126
6,252,533 B1 * 6/2001 Tafuru ......................... 341/144
6,295,014 B1 * 9/2001 Eastty et al. ................. 341/143

FOREIGN PATENT DOCUMENTS

| JP | 64-47113 | 2/1989 | .......... H03M/17/02 |
| JP | 4-61509 | 2/1992 | .......... H03M/17/02 |
| WO | 99/38090 | 7/1999 | ............ G06F/17/17 |

* cited by examiner

Primary Examiner—Peguy JeanPierre
(74) Attorney, Agent, or Firm—Dellett & Walters

(57) ABSTRACT

It is object to provide an oversampling circuit and a digital to analog converter capable of realizing a smaller circuit and reducing a cost of parts. The oversampling circuit comprises four D flip-flops 10-1 through 10-4, four multipliers 12-1 through 12-4, three adders 14-1 through 14-3, and two integrating circuits 16-1 and 16-2. Input data is sequentially input into the four D flip-flops, and held therein. Each multiplier performs a multiplying process on the data held in the D flip-flops respectively corresponding one to one to the multipliers by different multiplicators in the first half and second half of one clock period. The multiplication results are added up by the three adders. Furthermore, two digital integrating operations corresponding to the sum are carries out by means of the two-integrating circuits.

9 Claims, 13 Drawing Sheets

F/G. 1
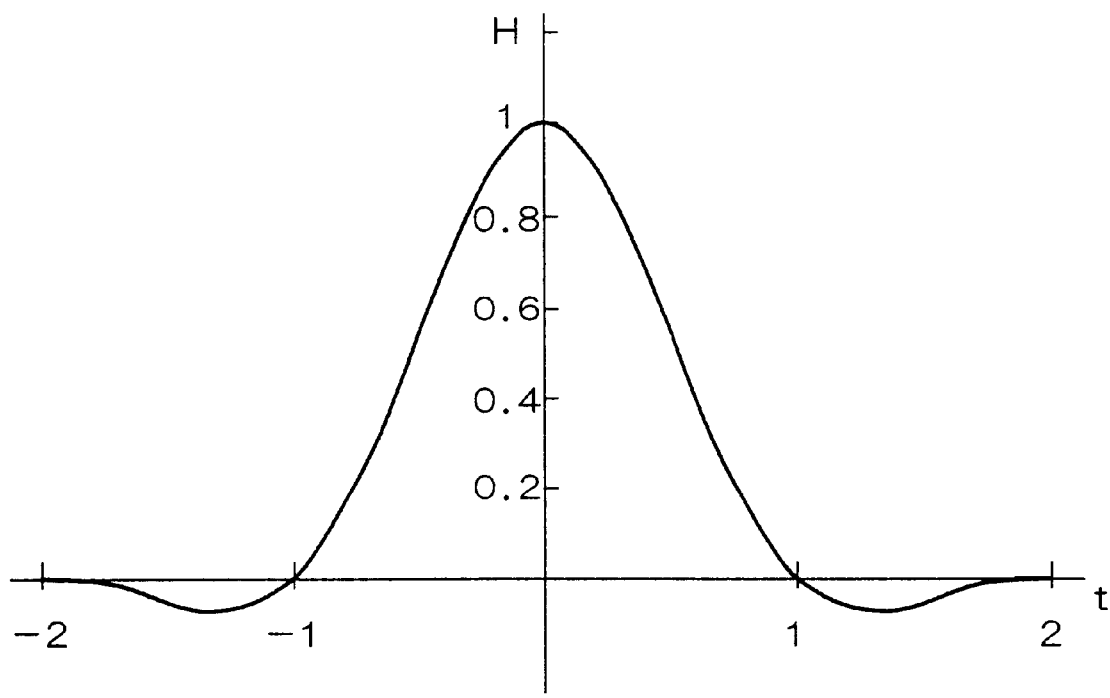
F/G. 2
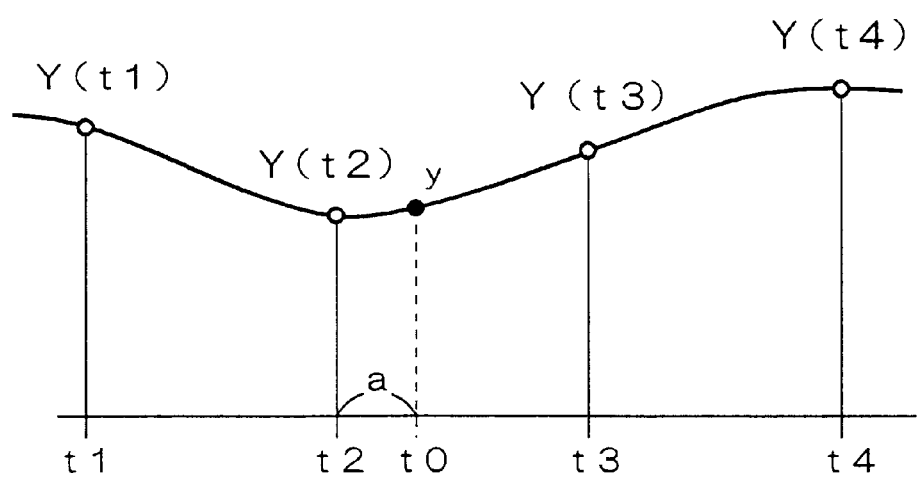

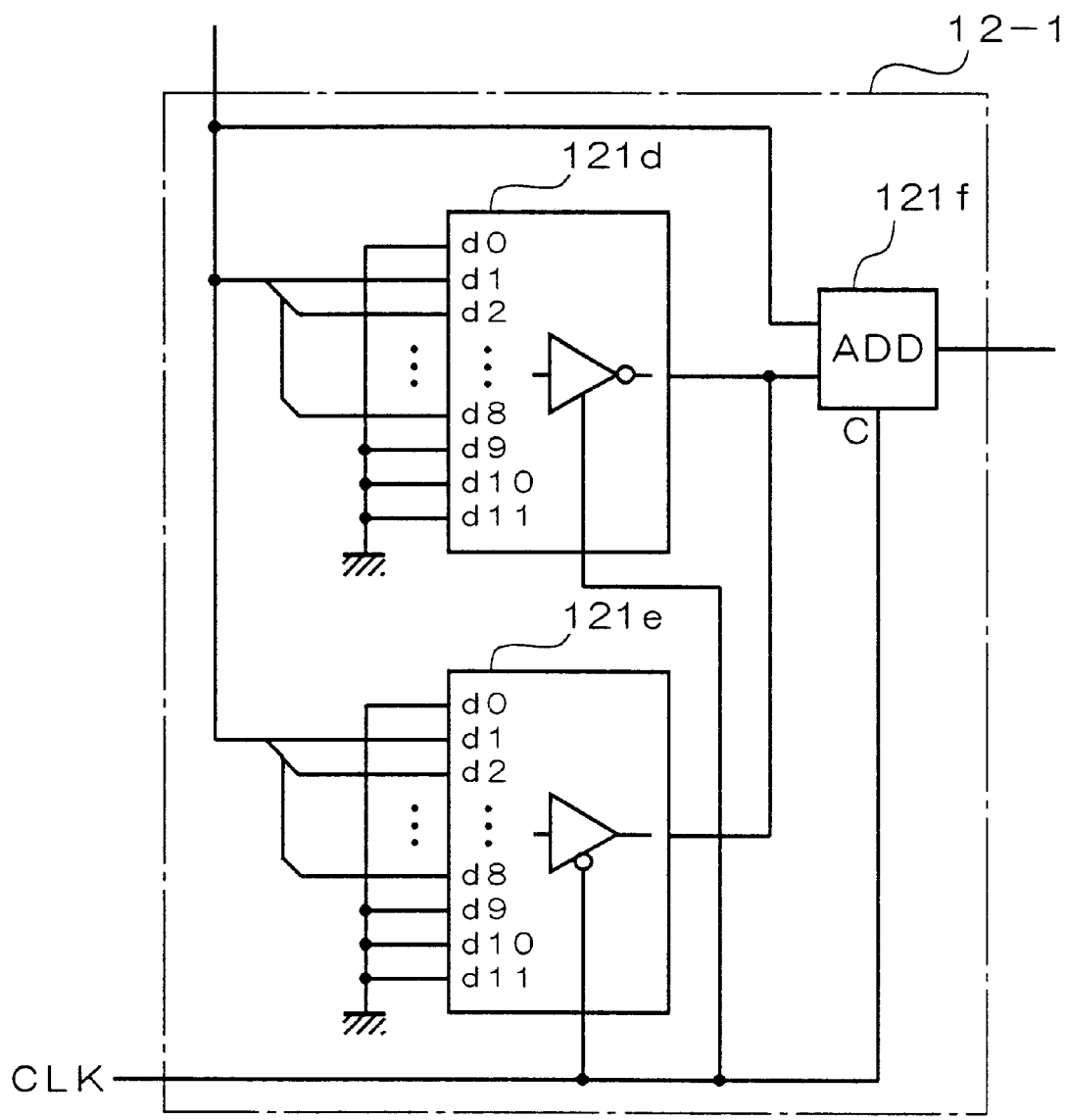
F I G. 13

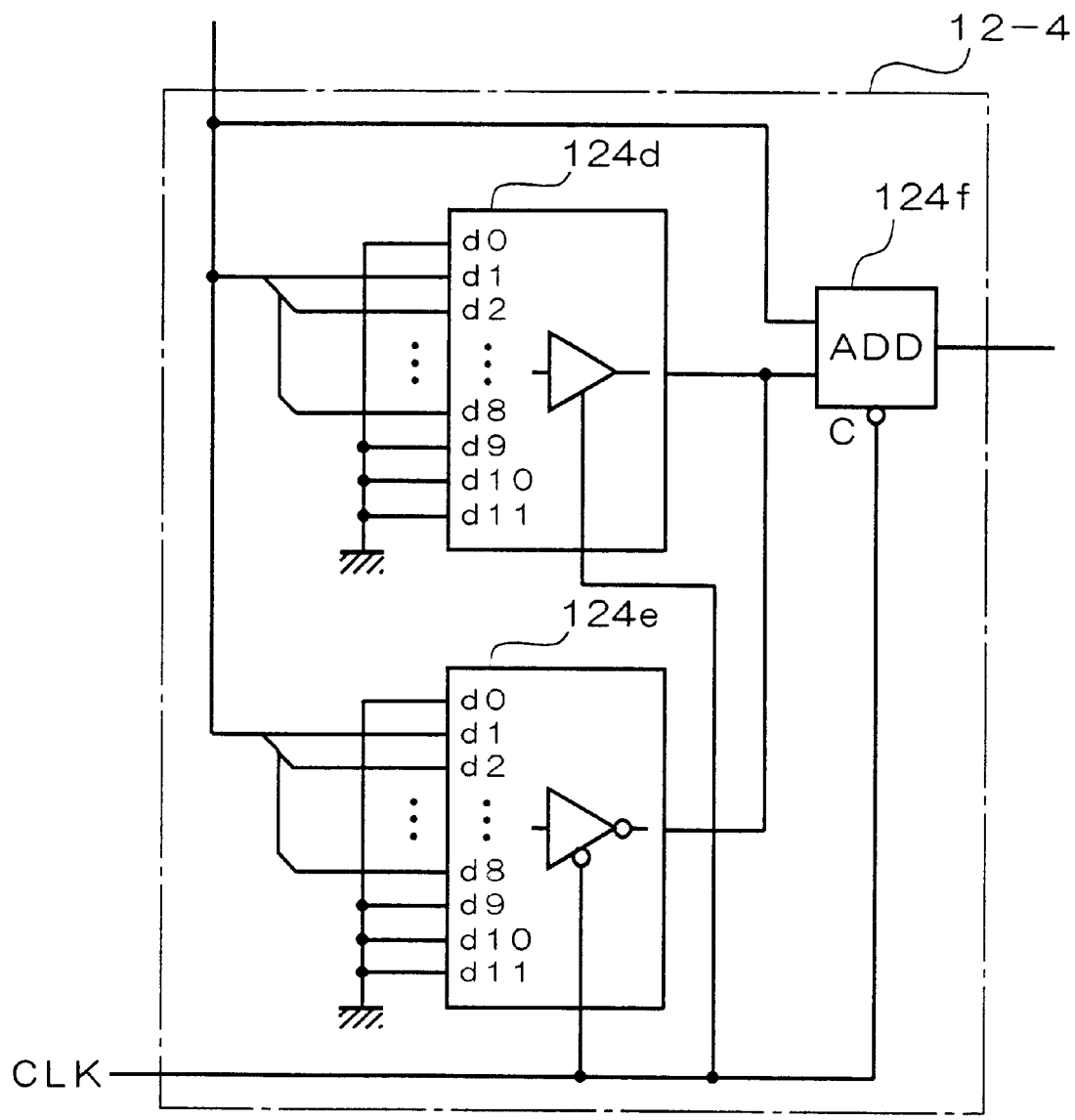
F I G. 16

OVERSAMPLING CIRCUIT DIGITAL/ANALOG CONVERTER

TECHNICAL FIELD

The present invention relates to an over sampling circuit for interpolating input data discretely and a digital-to-analog converter to which the oversampling circuit is applied. In this specification, it is assumed that a case where function values have finite values except zero in a local region and become zero in regions different from the region is called a "local support."

BACKGROUND ART

A recent digital audio apparatus, for example, a CD (Compact Disk) player, uses a D/A (digital-to-analog) converter to which an over-sampling technique is applied to obtain a continuous analog audio signal from discrete music data (digital data). Such a D/A converter generally uses a digital filter to raise a pseudo sampling frequency by interpolating input digital data, and outputs smooth analog audio signals by passing each interpolation value through a low-pass filter after generating a staircase signal waveform with each interpolation value held by the sample holding circuit.

A data interpolation system disclosed in WO99/38090 is well known as a method of interpolating data into discrete digital data. In this data interpolation system, differentiation can be performed only once in the whole range, and a sampling function is used such that two sampling points each before and after an interpolation position, that is, a total of four sampling points, can be considered. Since the sampling function has values of a local support unlike the sinc function defined by sin $(\pi ft)/(\pi ft)$ where f indicates a sampling frequency, there is a merit that no truncation errors occur although only four pieces of digital data are used in the interpolating operation.

Generally, oversampling is performed by using a digital filter in which the waveform data of the above mentioned sampling function is set to a tap coefficient of an FIR (finite impulse response) filter.

If the oversampling technology of performing an interpolating operation for discrete digital data using the above mentioned digital filter, a low pass filter having a moderate attenuation characteristic can be used. Therefore, the phase characteristic with a low pass filter can approach a linear phase characteristic, and the sampling aliasing noise can be reduced. These effects are more outstanding with a higher oversampling frequency. However, if the sampling frequency becomes higher, the number of taps of the digital filter is also increased. As a result, there arises the problem of a larger circuit. In addition, the performance of the delay circuit or multiplier comprises the digital filter is also sped up. Therefore, it is necessary to use expensive parts appropriate for the quick performance, thereby increasing the cost of the required parts. Especially, when the oversampling process is performed using a digital filter, an actual value of a sampling function is used as a tap coefficient. Therefore, the configuration of a multiplier is complicated, and the cost of the parts furthermore increases.

Moreover, although a digital-to-analog converter can be configured by connecting a low pass filter after the over-sampling circuit, the above mentioned various problems with the conventional oversampling circuit have also occurred with the digital-to-analog converter configured using the circuit.

BRIEF SUMMARY OF THE INVENTION

The present invention has been achieved to solve the above mentioned problems, and aims at providing an over-sampling circuit and a digital-to-analog converter having a smaller circuit at a lower cost of parts.

In the oversampling circuit according to the present invention, a plurality of data holding unit hold plural pieces of digital data input at predetermined intervals, and a plurality of multiplying unit perform multiplying processes using respective multiplicators for the first and the second of the data holding periods on the digital data held in the respective data holding unit. By performing digital integration plural times on the digital data obtained by adding unit adding up multiplication results, digital data whose values change stepwise is output along a smooth curve. Thus, the multiplication results corresponding to sequentially input plural pieces of digital data are added up, and then the digital integration is performed on the addition result. As a result, output data whose values smoothly change can be obtained. Therefore, when an oversampling frequency is high, it is necessary only to speed up the digital integration, thereby avoiding the conventional complicated configuration, that is, simplifying the configuration, and reducing the cost of parts.

Each of the multiplicators used in the multiplying processes by the plurality of multiplying unit is desired to correspond to each of the values of step functions obtained by differentiating plural times piecewise polynomials for a predetermined sampling function configured by the piecewise polynomials. That is, by integrating plural times the above mentioned step function, a waveform corresponding to the predetermined sampling function can be obtained. Therefore, a convolution operation using a sampling function can be equivalently realized by generating a step function. As a result, the contents of the entire process can be simplified, and the number of processes required over-sampling can be successfully reduced.

In addition, the above mentioned step function is desired to equally set the positive and negative areas. Thus, the divergence of integration results of the integrating unit can be prevented.

Furthermore, it is desirable that the above mentioned sampling function has a value of local support with the whole range differentiable only once. It is assumed that a natural phenomenon can be approximated if the whole range is differentiable only once. By setting a smaller number of times of differentiation, the times of the digital integration performed by the integrating unit can be reduced, thereby successfully simplifying the configuration.

It is further desirable that the above mentioned step function contains an area of eight piecewise sections in equal width weighted by −1, +3, +5, −7, −7, +5, +3, and −1 in a predetermined range corresponding to five pieces of digital data arranged at equal intervals, and that every two of the eight weight coefficients are set as the multiplicators in the respective multiplying unit. Since simple weight coefficients represented by integers can be used as the multiplicators in each of the respective multiplying unit, the multiplying process can be simplified.

Especially, it is desirable that a multiplying process performed in each of the plurality of multiplying unit is represented by adding digital data to an operation result of the exponentiation of 2 by a bit shift. Since the multiplying process can be replaced with a bit shift process and an adding operation, the configuration can be simplified and the process can be sped up by simplifying the contents of the processes.

It is also desirable that the times of the digital integration is two, and an data whose value changes like a quadric function is output from the integrating unit. For smooth interpolating plural pieces of discrete data, it is necessary at least to change a value like a quadric function. Since it can be realized only by setting the number of times of the digital integration to 2, the configuration of the integrating unit can be simplified.

Furthermore, the digital integration performed by the integrating unit is a process of accumulating input data, and it is desirable that the process is repeated n times in a period of inputting digital data into the data holding unit. Thus, the operation of accumulating data can be realized only by adding input data to held data. Therefore, the configuration of the integrating unit can be simplified, and the process can be easily and more quickly repeated. As a result, the value of the multiple n of the oversampling can be set to a large value without complicating the configuration and largely increasing the cost of parts.

In addition, the digital-to-analog converter can be configured only by providing voltage generation unit and smoothing unit at the stage after the above mentioned oversampling circuit. Accordingly, the digital-to-analog converter according to the present invention can be realized with a simplified configuration and reduced cost of parts. Furthermore, the above mentioned oversampling circuit can easily set a high oversampling frequency without complicating the configuration or largely increasing the cost of parts. As a result, the distortion of the output waveform of the digital-to-analog converter to which the oversampling circuit is applied can be minimized.

BRIEF DESCRIPTION OF THE DRAWINGS

FIG. 1 is a diagram showing a sampling function used in an interpolating operation in the oversampling circuit according to an embodiment;

FIG. 2 is a diagram showing a relationship between the sampling values with an interpolation values;

FIG. 13 is a diagram showing a detailed configuration of the multiplier;

FIG. 16 is a diagram showing a detailed configuration of the multiplier; and

BEST MODE FOR CARRYING OUT THE INVENTION

An embodiment of the oversampling circuit according to the present invention is described below in detail by referring to the attached drawings. FIG. 1 shows a sampling function used in an interpolating operation in the oversampling circuit according to the present embodiment. The sampling function H(t) is disclosed by WO99/38090, and represented by the following expressions.

$$(-t^2-4t-4)/4; -2 \leq t < -3/2$$
$$(3t^2+8t+5)/4; -3/2 \leq t < -1$$
$$(5t^2+12t+7)/4; -1 \leq t < -1/2$$
$$(-7t^2+4)/4; -1/2 \leq t < 0$$
$$(-7t^2+4)/4; 0 \leq t < 1/2$$
$$(5t^2-12t+7)/4; 1/2 \leq t < 1$$
$$(3t^2-8t+5)/4; 1 \leq t < 3/2$$
$$(-t^2+4t-4)/4; 3/2 \leq t \leq 2 \qquad (1)$$

where t=0, ±1, ±2 indicates the sampling position. The sampling function H(t) shown in FIG. 1 can be differentiated only once in the whole range, and is a function of local support converging into 0 with the sampling position t=±2. By performing an overlapping process using the sampling function H(t) based on each sampling value, the interpolating process can be performed using a function differentiable only once in the sampling values.

FIG. 2 shows the relationship between the sampling values and the interpolation values. As shown in FIG. 2, assume that four sampling positions are t1, t2, t3, and t4, and the distance between two adjacent sampling positions is 1. The interpolation value y corresponding to the interpolation position t0 between the sampling positions t2 and t3 is obtained by the following equation.

$$y=Y(t1) \cdot H(1+a)+Y(t2) \cdot H(a)+Y(b3) \cdot H(1-a)+Y(t4) \cdot H(2-a) \qquad (2)$$

where Y (t) indicates each sampling value at the sampling position t. Each of 1+a, a, 1−a, and 2−a indicates the distance between the interpolation position t0 and each of the sampling positions t1 through t4.

As described above, by performing a convolution operation by computing the value of the sampling function H(t) corresponding to each sampling value, an interpolation value of sampling values can be obtained theoretically. However, the sampling function shown in FIG. 1 is a quadric piecewise polynomial differentiable only once in the whole range. Using this feature, the interpolation value can be obtained in another equivalent process procedure.

Figure 3:
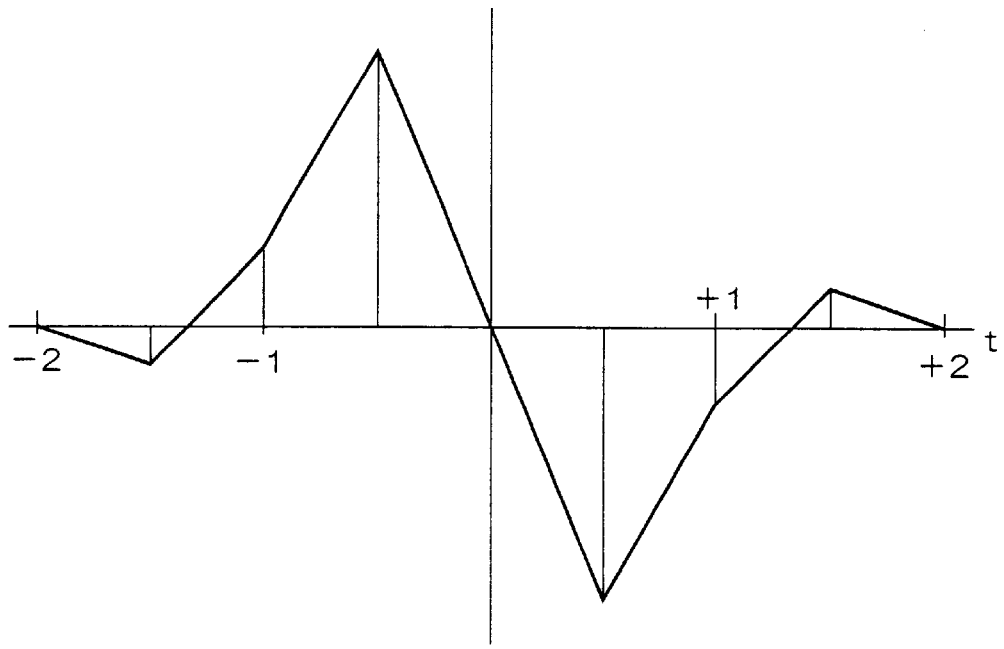
FIG. 3 is a diagram showing a waveform obtained by differentiating once the sampling function shown in FIG. 1.

FIG. 3 shows a waveform obtained by differentiating once the sampling function shown in FIG. 1. The sampling function H(t) shown in FIG. 1 is a quadric piecewise polynomial differentiable once in the entire range. Therefore, by performing the differentiation once, a polygonal line function formed by the waveform of a continuous polygonal line as shown in FIG. 3 can be obtained.

Figure 4:
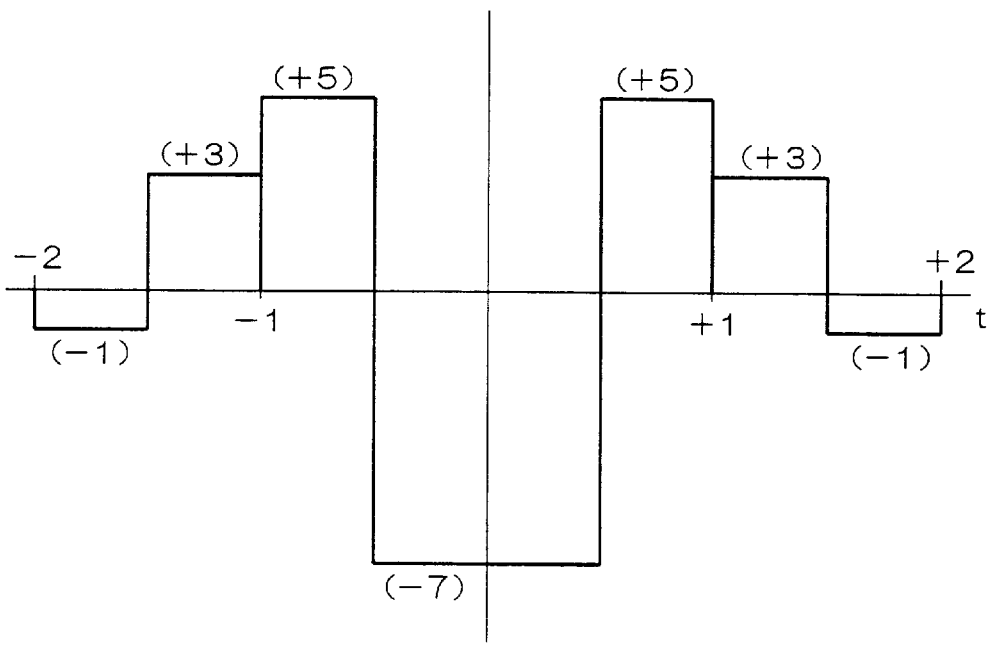
FIG. 4 is a diagram showing a the waveform obtained by further differentiating the polygonal line function shown in FIG. 3.

FIG. 4 shows the waveform obtained by further differentiating the polygonal line function shown in FIG. 3. However, the polygonal line waveform contains a plurality of corner points, and the differentiation cannot be performed in the whole range. Therefore, the differentiation is performed on the linear portion between two adjacent corner points. By differentiating the polygonal line waveform shown in FIG. 3, the step function formed by the stepwise waveform as shown in FIG. 4 can be obtained.

Thus, the above mentioned sampling function H(t) is once differentiated in the entire range to obtain a polygonal line function. By further differentiating each of the linear portions of the polygonal line function, a step function can be obtained. Therefore, in the reverse order, by generating the step function shown in FIG. 4, and integrating it twice, the sampling function H(t) shown in FIG. 1 can be obtained.

In the step function shown in FIG. 4, the positive and negative areas are set equal to each other, and the sum of the areas equals 0. That is, by integrating such a step function plural times, a sampling function of local support, as shown in FIG. 1, whose differentiability in the whole range is guaranteed can be obtained.

In computing the interpolation value in the convolution operation shown by the equation (2), the value of the sampling function H(t) is multiplied by each sampling value. If the sampling function H(t) is obtained by integrating twice the step function shown in FIG. 4, the value of the sampling function obtained in the integrating process is multiplied by each sampling value, or equivalently, when a step function before the integration processing is generated, an interpolation value can be obtained by generating a step function by multiplication by each sampling value, and performing twice the integrating process on the result obtained in the convolution operation using the step function. The oversampling circuit according to the present embodiment obtains an interpolation value as described above. This process is described below in detail.

Figure 5:
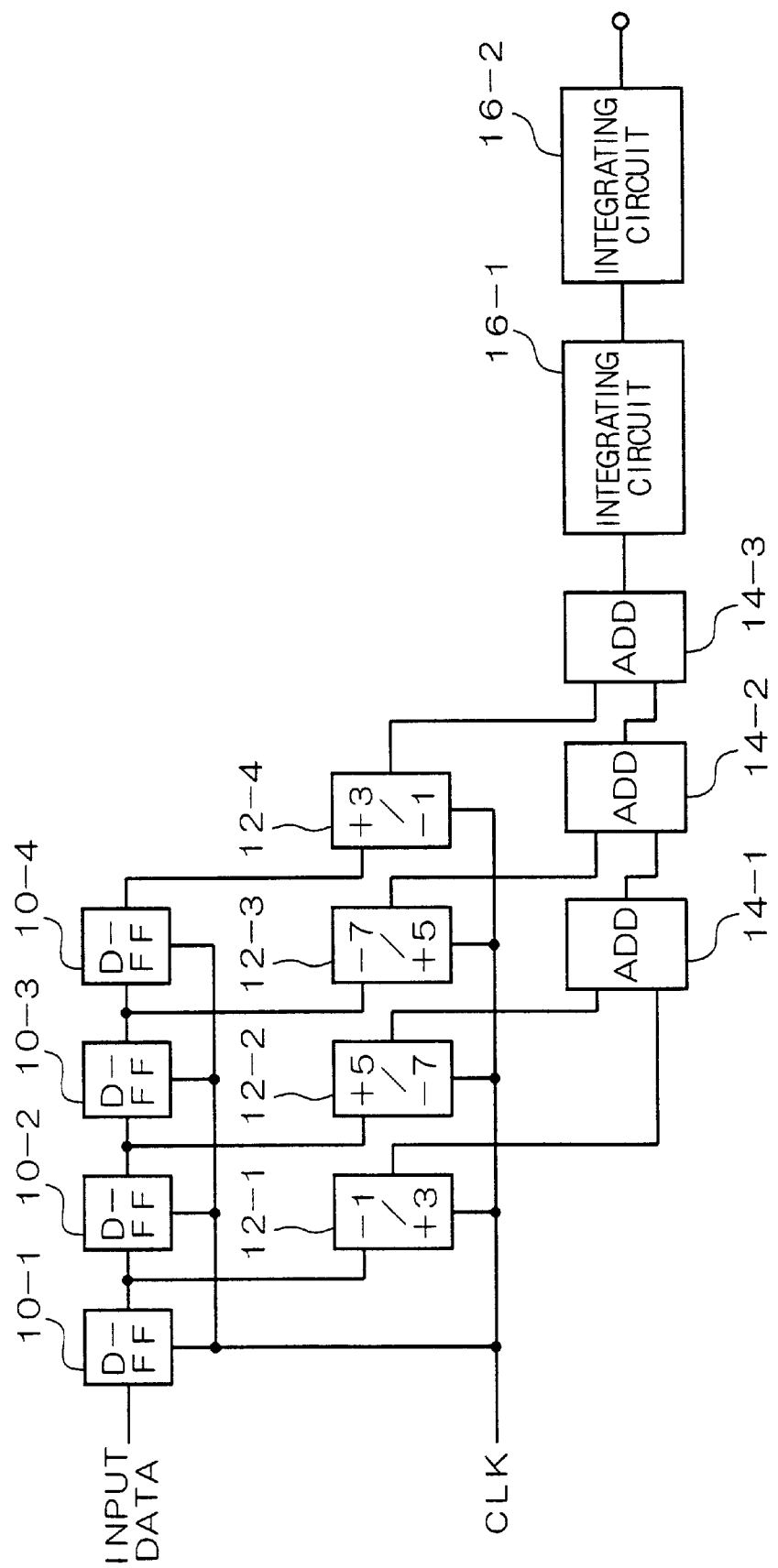
FIG. 5 is a diagram showing a the configuration of an oversampling circuit of an embodiment.

FIG. 5 shows the configuration of the oversampling circuit according to the present embodiment. The oversampling circuit shown in FIG. 5 is configured by four D flip-flop (D-FF)s 10-1, 10-2, 10-3, and 10-4, four multipliers 12-1, 12-2, 12-3, and 12-4, three adder (ADD)s 14-1, 14-2, and 14-3, and two integrating circuits 16-1 and 16-2.

The four serially connected D flip-flops 10-1 through 10-4 hold data synchronous with a clock signal CLK, sequentially fetch the digital data input to the first D flip-flop 10-1, and hold the value. For example, assuming that data $D_1, D_2, D_3, D_4, \ldots$ are sequentially input into the first D flip-flop 10-1, the third, second, and first input data $D_3$, $D_2$, and $D_1$ are respectively held in the second, third, and fourth D flip-flops 10-2, 10-3, and 10-4 at the timing of holding the fourth input data $D_4$ in the first D flip-flop 10-1.

Each of the four multipliers 12-1 through 12-4 has two types of multiplicators, and performs different multiplying processes between the first half and the second half of each period of the clock signal CLK. For example, the multiplier 12-1 performs the multiplying process using a multiplicator of −1 in the first half of each period of the clock signal CLK, and performs the multiplying process using a multiplicator of +3 in the second half. The multiplier 12-2 performs the multiplying process using a multiplicator of +5 in the first half of each period of the clock signal CLK, and performs the multiplying process using a multiplicator of −7 in the second half. The multiplier 12-3 performs the multiplying process using a multiplicator of −7 in the first half of each period of the clock signal CLK, and performs the multiplying process using a multiplicator of +5 in the second half. The multiplier 12-4 performs the multiplying process using a multiplicator of +3 in the first half of each period of the clock signal CLK, and performs the multiplying process using a multiplicator of −1 in the second half.

Each value of the step function shown in FIG. 4 can be obtained by differentiating twice each piecewise polynomial in the above mentioned expressions (1) as follows.

$$-1; -2 \leq t < -3/2$$

$$+3; -3/2 \leq t < -1$$

$$+5; -1 \leq t < -1/2$$

$$-7; -1/2 \leq t < 0$$

$$-7; 0 \leq t < 1/2$$

$$+5; 1/2 \leq t < 1$$

$$+3; 1 \leq t < 3/2$$

$$-1; 3/2 \leq t \leq 2$$

Regarding the portion where the sampling position t ranges from −2 to −1, the values of the step function are −1 in the first half, and +3 in the second half. These values correspond to the multiplicators of the multiplier 12-1. Similarly, regarding the portion where the sampling position t ranges from −1 to 0, the values of the step function are +5 in the first half, and −7 in the second half. These values correspond to the multiplicators of the multiplier 12-2. Regarding the portion where the sampling position t ranges from 0 to +1, the values of the step function are −7 in the first half, and +5 in the second half. These values correspond to the multiplicators of the multiplier 12-3. Regarding the portion where the sampling position t ranges from +1 to +2, the values of the step function are +3 in the first half, and −1 in the second half. These values correspond to the multiplicators of the multiplier 12-4.

Each of the three adders 14-1 through 14-3 is used to add up the multiplication results of the above mentioned four multipliers 12-1 through 12-4. The adder 14-1 adds up the multiplication results of the two multipliers 12-1 and 12-2. The adder 14-2 adds up the multiplication result of the multiplier 12-3 and the addition result of the adder 14-1. Furthermore, the adder 14-3 adds up the multiplication result of the multiplier 12-4 and the addition result of the adder 14-2. Using these three adders 14-1 through 14-3, the multiplication results of the four multipliers 12-1 through 12-4 are added up. Since multiplying processes are performed using different multiplicators between the first half and the second half of each period of the clock signal CLK in each of the multipliers 12-1 through 12-4 as described above, the output value of the adder 14-3 obtained by adding up the multiplication results also refers to the digital data in the form of steps having different values between the first half and the second half of each period of the clock signal CLK.

According to the present embodiment, four multiplication results of the four multipliers 12-1 through 12-4 are added up by the three adders 14-1 through 14-3, but the number of adders can be reduced by using an adder having three or more input terminals.

The two serially connected integrating circuits 16-1 and 16-2 perform two integrating processes on the data output from adder 14-3. A linearly changing data (like a linear function) is output from the integrating circuit 16-1 at the first stage, and a data changing like a quadric function is output from the integrating circuit 16-2 at the subsequent stage.

Figure 6:
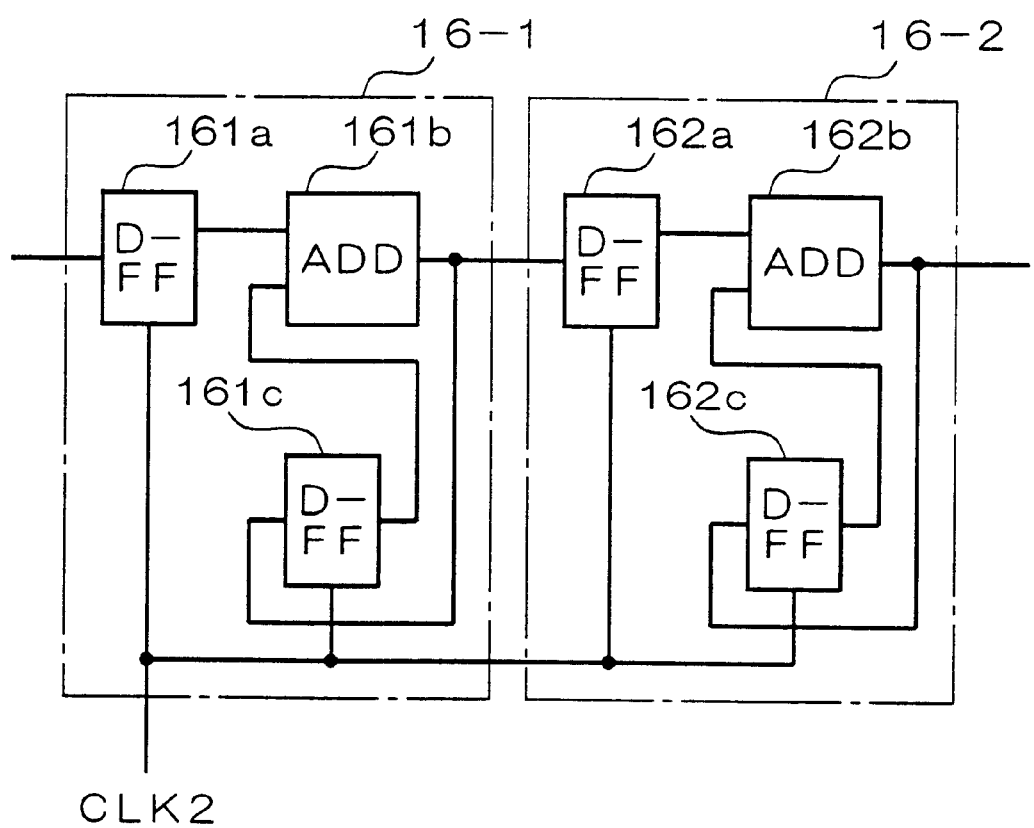
FIG. 6 is a block diagram showing a detailed configuration of an integrating circuit included in the oversampling circuit shown in FIG. 5.

FIG. 6 shows the detailed configuration of the integrating circuits 16-1 and 16-2. The integrating circuit 16-1 at the preceding stage comprises two D flip-flops (D-FF) 161*a* and 161c and an adder (ADD) 161b. The adder 161b has two input terminals. Data output from the adder 14-3 and temporarily held in the D flip-flop 161a is input into one input terminal, and data output from the adder 161b itself and temporarily held in the D flip-flop 161c is input into the other input terminal. Each of the D flip-flops 161a and 161c holds the data synchronous with the clock signal CLK2 for an integrating operation. The clock signal CLK2 corresponds to the oversampling frequency, and is set to the frequency n times as high as the frequency of the clock signal CLK input to the D flip-flops 10-1 through 10-4 and the multipliers 12-1 through 12-4. Therefore, when the data output from the adder 14-3 is input into the integrating circuit 16-1 with the above mentioned configuration, a digital integrating operation for accumulating the input data is performed in synchronization with the clock signal CLK2.

The integrating circuit 16-2 at the subsequent stage has the basically the same configuration as the above mentioned integrating circuit 16-1 at the preceding stage, and comprises two D flip-flops (D-FF) 162a and 162c and an adder (ADD) 162b. When data output from the integrating circuit 16-1 at the preceding stage is input into the integrating circuit 16-2 with the above mentioned configuration, a digital integrating operation for accumulating the input data is performed in synchronization with the clock signal CLK2.

Thus, when plural pieces of digital data are input into the D flip-flop 10-1 at the first stage at predetermined intervals, plural pieces of digital data for interpolation of digital data are obtained from the integrating circuit 16-2 at the subsequent stage.

The above mentioned D flip-flops 10-1 through 10-4 correspond to a plurality of data holding unit, the multipliers 12-1 through 12-4 correspond to a plurality of multiplying unit, the adders 14-1 through 14-3 correspond to adding unit, and the integrating circuits 16-1 and 16-2 correspond to integrating unit.

FIGS. 7A to 7L show operation timings of the oversampling circuit according to the present embodiment. In synchronization with the rise of each period of the clock signal CLK shown in FIG. 7A, the data $D_1$, $D_2$, $D_3$, $D_4$, . . . are sequentially input into the first D flip-flop 10-1. FIGS. 7B to 7E show the contents of the data held in the D flip-flops 10-1 through 10-4 respectively. In the explanation below, for example, the timing of one clock of holding the fourth input data $D_4$ in the first D flip-flop 10-1 is considered.

At the timing of holding the fourth input data $D_4$ in the first D flip-flop 10-1, the third input data $D_3$ is held in the second D flip-flop 10-2, the second input data $D_2$ is held in the third D flip-flop 10-3, and the first input data $D_1$ is held in the fourth D flip-flop 10-4.

Figure 7A:
FIGS. 7A through 7L are charts showing the operation timings of the oversampling circuit of an embodiment.
Figure 7B:
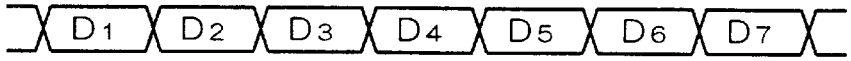
Figure 7C:
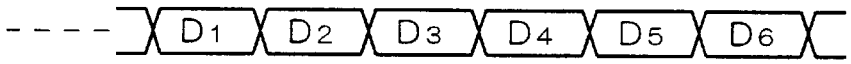
Figure 7D:
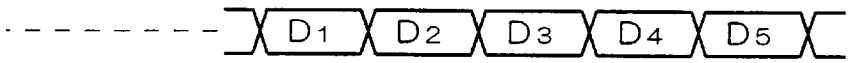
Figure 7E:
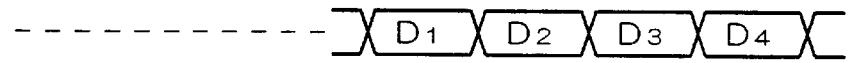
Figure 7F:
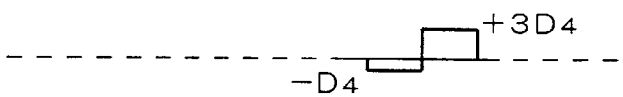
Figure 7G:
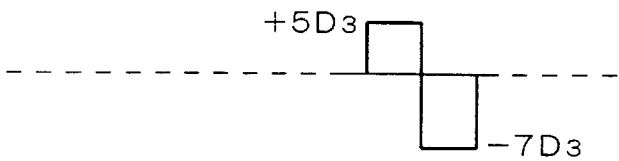
Figure 7H:
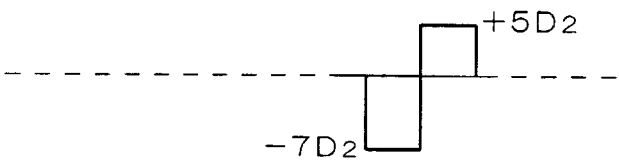
Figure 7I:
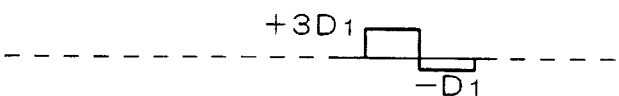
Figure 7J:
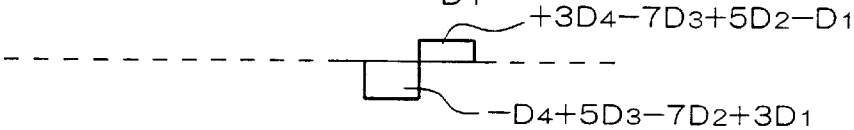

The multiplier 12-1 receives the data $D_4$ held in the first D flip-flop 10-1, outputs in the first half of one clock period the multiplication result of $-D_4$ obtained by multiplying the input data $D_4$ by $-1$, and outputs in the second half the multiplication result of $+3D_4$ obtained by multiplying the input data $D_4$ by +3 (FIG. 7F). Similarly, the multiplier 12-2 receives the data $D_3$ held in the second D flip-flop 10-2, outputs in the first half of one clock period the multiplication result of $+5D_3$ obtained by multiplying the input data $D_3$ by +5, and outputs in the second half the multiplication result of $-7D_3$ obtained by multiplying the input data $D_3$ by $-7$ (FIG. 7G). The multiplier 12-3 receives the data $D_2$ held in the third D flip-flop 10-3, outputs in the first half of one clock period the multiplication result of $-7D_2$ obtained by multiplying the input data $D_2$ by $-7$, and outputs in the second half the multiplication result of $+5D_2$ obtained by multiplying the input data $D_2$ by +5 (FIG. 7H). The multiplier 12-4 receives the data D, held in the fourth D flip-flop 10-4, outputs in the first half of one clock period the multiplication result of $+3D$, obtained by multiplying the input data D, by +3, and outputs in the second half the multiplication result of $-D_1$ obtained by multiplying the input data $D_1$ by $-1$ (FIG. 7I).

The three adders 14-1 through 14-3 add up the four multiplication results obtained by the four multipliers 12-1 through 12-4. Therefore, in the first half of one clock period, the adder 14-3 outputs the addition result $(-D_4+5D_3-7D_2+3D_1)$ obtained by adding up the multiplication results obtained in the first half of one clock period by the four multipliers 12-1 through 12-4. In the second half of one clock period, the adder 14-3 outputs the addition result $(3D_4-7D_3+5D_2-D_1)$ obtained by adding up the multiplication results obtained in the second half of one clock period by the four multipliers 12-1 through 12-4.

Figure 7K:
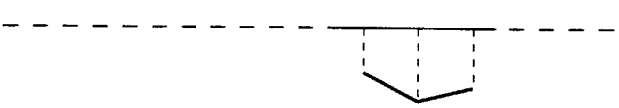
Figure 7L:
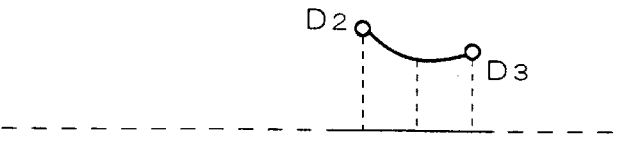

Thus, when addition results are sequentially output in the form of steps from the adder 14-3 (FIG. 7J), the integrating circuit 16-1 at the preceding stage outputs plural pieces of data whose values change in the form of the polygonal line by integrating the waveform (FIG. 7K). The integrating circuit 16-2 at the subsequent stage further integrates the data whose values changes in the form of the polygonal line, and outputs plural pieces of data whose values change along a smooth curve differentiable only once between the digital data $D_2$ and $D_3$ (FIG. 7L).

Figure 8A:
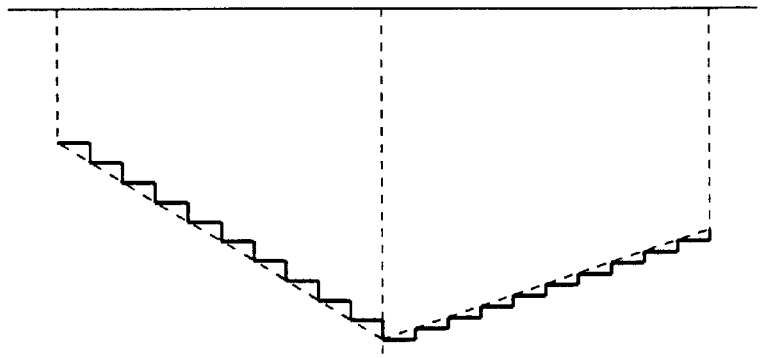
FIGS. 8A and 8B are diagrams showing detailed data output from the integrating circuits.
Figure 8B:
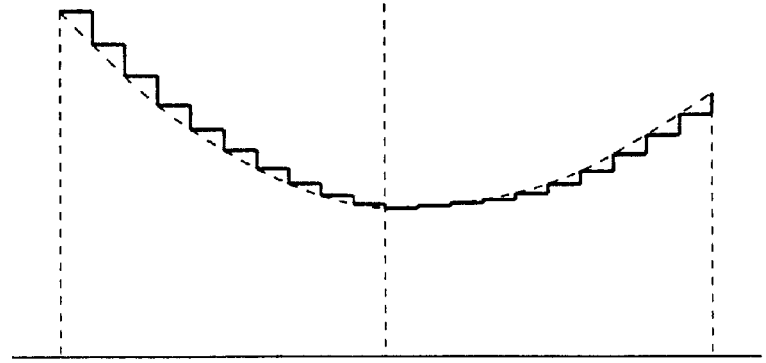

FIGS. 8A and 8B show the details of the data output from the two integrating circuits 16-1 and 16-2. For example, the frequency of the clock signal CLK2 for an integrating operation input into each of the integrating circuits 16-1 and 16-2 is set to 20 times as high as the sampling frequency (frequency of the clock signal CLK) of the input data. As shown in FIG. 8A, the plural pieces of data output from the integrating circuit 16-1 at the preceding stage have values changing like a linear function. As shown in FIG. 8B, the plural pieces of data output from the integrating circuit 16-2 at the subsequent stage have values changing like a quadric function.

In each of the integrating circuits 16-1 and 16-2 whose configurations are shown in FIG. 6, a digital integrating process is performed by simply accumulating input data. Therefore, since the value of the data output therefrom becomes larger depending on the multiple of the oversampling, it is necessary to provide a division circuit at the output stage of each of the integrating circuits 16-1 and 16-2 in order to make the values of input output data coincident. For example, in the example shown in FIG. 8, since the value of the output data is 20 times as large as the input data, a division circuit having a divisor of 20 is provided at the end of each of the integrating circuits 16-1 and 16-2. However, when a multiple of the oversampling is set to a value of the power of 2 (for example, 2, 4, 8, 16, . . . ), a dividing process can be performed on output data by bit-shifting the output data of each of the integrating circuits 16-1 and 16-2 toward lower bits, thereby omitting the above mentioned division circuit. For example, when the multiple of the oversampling is set to 16, the output data from each of the integrating circuits 16-1 and 16-2 can be shifted by 5 bits toward lower bits. Therefore, the wiring at the output terminal of each circuit can be shifted by 5 bits in advance.

Thus, the oversampling circuit according to the present embodiment sequentially holds the input digital data in the four serially connected D flip-flops 10-1 through 10-4, respectively corresponding to which four multipliers 12-1 through 12-4 perform different multiplying processes between the first half and the second half of one clock period as data holding period. Then, the adders 14-1 through 14-3 add the multiplication results. And then, by performing a digital integrating process twice by the two integrating circuits 16-1 and 16-2 on the data output from the adder 14-3, an oversampling process can be performed for increasing in a pseudo manner a sampling frequency n times as high as the frequency of each piece of the input digital data.

Thus, the oversampling circuit according to the present embodiment sets how many times the sampling frequency of the input data the oversampling frequency is to be set depends only on the frequency of the clock signal CLK2 input into the two integrating circuits 16-1 and 16-2. That is, the multiple of the oversampling can be set large only by configuring the two integrating circuits 16-1 and 16-2 using high-speed parts. Therefore, unlike the conventional method of performing the oversampling process using a digital filter, the entire circuit is not large although the frequency of the oversampling is set higher, thereby minimizing the increase of the cost of parts. Furthermore, the contents of the operations can be simplified by using the integer multiplicators of four multipliers 12-1 through 12-4, thereby simplifying the configuration of these multipliers, and reducing the cost of parts.

Furthermore, for example, when an oversampling process is performed to obtain a pseudo frequency n times as high as the sampling frequency (for examples, 1024 times), it has been necessary in the conventional method to have the operation speed of the parts as high as the pseudo frequency. However, according to the oversampling circuit of the present embodiment, except the two integrating circuits, it is necessary to operate the each multiplier and each adder at the frequency twice as high as the sampling frequency, thereby considerably reducing the operation speed of each part.

Described below is an example of a detailed configuration of each part of the oversampling circuit according to the present embodiment. FIGS. 9 through 12 show the configurations of the four multipliers 12-1 through 12-4.

Figure 9:
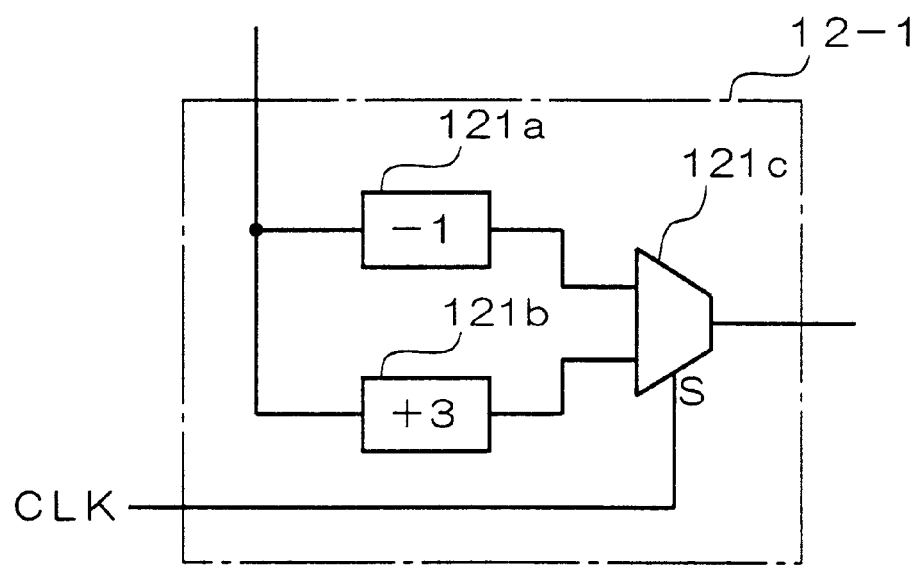
FIG. 9 is a diagram showing a detailed configuration of the multiplier.

As shown in FIG. 9, the multiplier 12-1 comprises two multipliers 121a and 121b in which values of multiplicator are fixed, and a selector 121c. One multiplier 121a performs a multiplying process using a multiplicator of −1, and the other multiplier 121b performs a multiplying process using a multiplicator of +3. The selector 121c receives the multiplication results of the two multipliers 121a and 121b, outputs a multiplication result obtained from one multiplier 121a using a multiplicator of −1 when the clock signal CLK input to the control terminal S indicates a high level, that is, in the first half of one clock period, and outputs a multiplication result obtained from the other multiplier 121b using a multiplicator of +3 when the clock signal CLK input to the control terminal S indicates a low level, that is, in the second half of one clock period.

Figure 10:
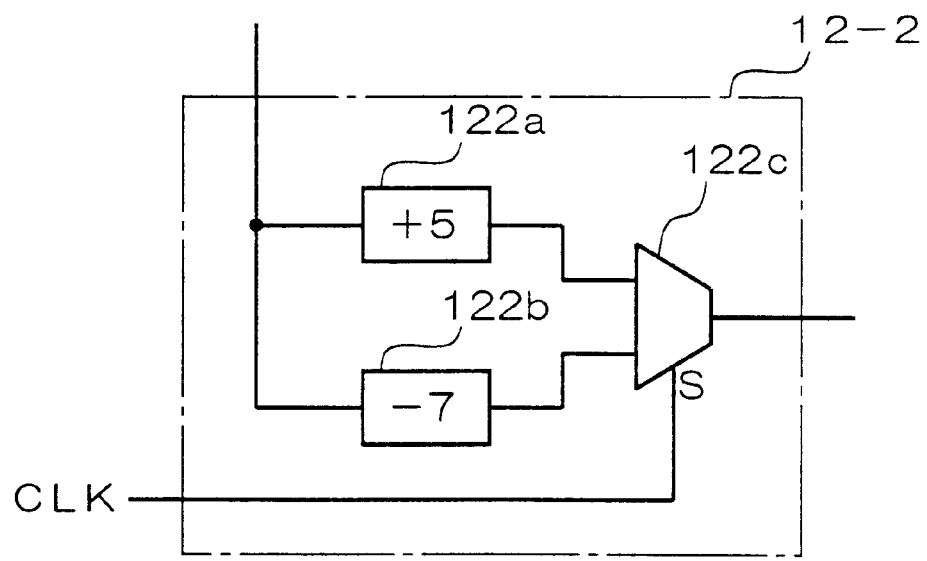
FIG. 10 is a diagram showing a detailed configuration of the multiplier.

Similarly, the multiplier 12-2 comprises two multipliers 122a and 122b in which values of multiplicator are fixed, and a selector 122c as shown in FIG. 10. One multiplier 122a performs a multiplying process using a multiplicator of +5, and the other multiplier 122b performs a multiplying process using a multiplicator of −7. The selector 122c receives the multiplication results of the two multipliers 122a and 122b, outputs a multiplication result obtained from one multiplier 122a using a multiplicator of +5 when the clock signal CLK input to the control terminal S indicates a high level (in the first half of one clock period), and outputs a multiplication result obtained from the other multiplier 122b using a multiplicator of −7 when the clock signal CLK input to the control terminal S indicates a low level (in the second half of one clock period).

Figure 11:
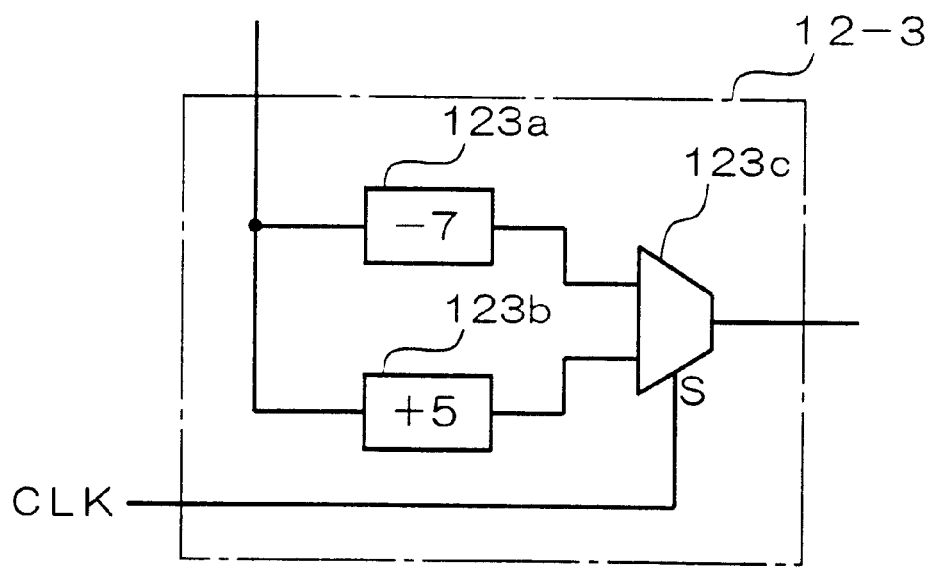
FIG. 11 is a diagram showing a detailed configuration of the multiplier.

As shown in FIG. 11, the multiplier 12-3 comprises two multipliers 123a and 123b in which multiplicator values are fixed, and a selector 123c. One multiplier 123a performs a multiplying process using a multiplicator of −7, and the other multiplier 123b performs a multiplying process using a multiplicator of +5. The selector 123c receives the multiplication results of the two multipliers 123a and 123b, outputs a multiplication result obtained from one multiplier 123a using a multiplicator of −7 when the clock signal CLK input to the control terminal S indicates a high level (in the first half of one clock period), and outputs a multiplication result obtained from the other multiplier 123b using a multiplicator of +5 when the clock signal CLK input to the control terminal S indicates a low level (in the second half of one clock period).

Figure 12:
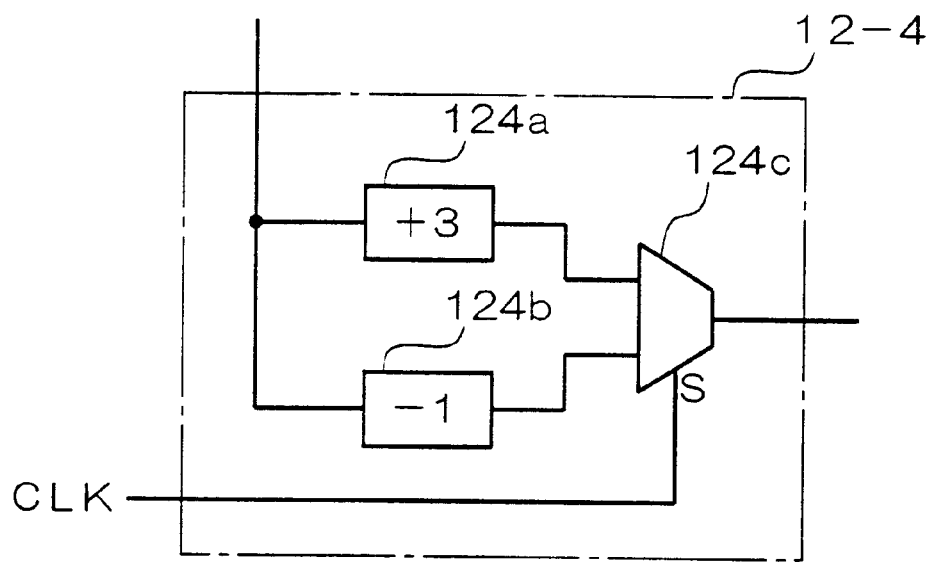
FIG. 12 is a diagram showing a detailed configuration of the multiplier.

As shown in FIG. 12, the multiplier 12-4 comprises two multipliers 124a and 124b in which values of multiplicator are fixed, and a selector 124c. One multiplier 124a performs a multiplying process using a multiplicator of +3, and the other multiplier 124b performs a multiplying process using a multiplicator of −1. The selector 124c receives the multiplication results of the two multipliers 124a and 124b, outputs a multiplication result obtained from one multiplier 124a using a multiplicator of +3 when the clock signal CLK input to the control terminal S indicates a high level (in the first half of one clock period), and outputs a multiplication result obtained from the other multiplier 124b using a multiplicator of −1 when the clock signal CLK input to the control terminal S indicates a low level (in the second half of one clock period).

Thus, each multiplier performs a multiplying process using different multiplicators between the first half and the second half of one clock period.

The above mentioned four multipliers 12-1 through 12-4 use four multiplicators of −1, +3, +5, and −7. When 1 is subtracted from each value of multiplicator, they are −2, +2, +4, and −8, that is, the values of the power of 2. As a result, the multiplying processes using these values as multiplicators can be realized by a simple bit shift. Regarding these specific values as multiplicators of each multiplier according to the present embodiment, the configuration of each multiplier can be simplified.

FIGS. 13 through 16 show the configurations of the four simplified multipliers 12-1 through 12-4.

The multiplier 12-1 comprises a tri-state buffer 121d having an inverting output terminal, a tri-state buffer 121e having a non-inverting output terminal, and an adder (ADD) 121f having two input terminals and carry terminal C as shown in FIG. 13.

When the clock signal CLK input to the control terminal indicates a high level (in the first half of one clock period), the tri-state buffer 121d shifts the input data to a higher bit by one bit, and inverts and outputs each bit of the shifted data, thereby performing a multiplying process by a multiplicator of −2. Actually, by obtaining a complement by adding 1 after inverting each bit, a multiplying process can be performed using a multiplicator of −2. The process of adding 1 is performed by the adder 121f at the subsequent stage.

Furthermore, when the clock signal inverted and input to the control terminal indicates a low level (in the second half of one clock period), the tri-state buffer 121e shifts the input data to a higher bit by one bit, and outputs the data, thereby performing a multiplying process by a multiplicator of 2.

The adder 121f adds the input data (the data output from the D flip-flop 10-1) before the multiplication to the multiplication result output from any of the two tri-state buffers 121d and 121e, and further adds 1 corresponding to the carry when the clock signal CLK input to the carry terminal C indicates a high level (in the first half of one clock period). As described above, the addition of 1 corresponding to the carry is performed to obtain a complement using the tri-state buffer 121d.

Since the operation of only the tri-state buffer 121d is valid in the first half of one clock period in the multiplier 12-1 with the above mentioned configuration, the adder 121f outputs a sum (−2D+D=−D) obtained by adding the input data D to the multiplication result (−2D) obtained by multiplying the input data D by −2. In the second half of one clock period, since the operation of only the other tri-state buffer 121e is valid, the adder 121f outputs a sum (+2D+D=+3D) obtained by adding the input data D to the multiplication result (+2D) obtained by multiplying the input data D by +2.

Thus, by performing multiplying processes using multiplicators of −1 and +3 by combining the multiplying process of the exponentiation of 2 by a bit shift with the adding process, the multiplier 12-1 can be configured only by tri-state buffers and an adder, thereby simplifying the configuration. Especially, since the output of the two tri-state buffers is selectively used, the output terminals can be wired OR-connected, thereby furthermore simplifying the configuration.

Figure 14:
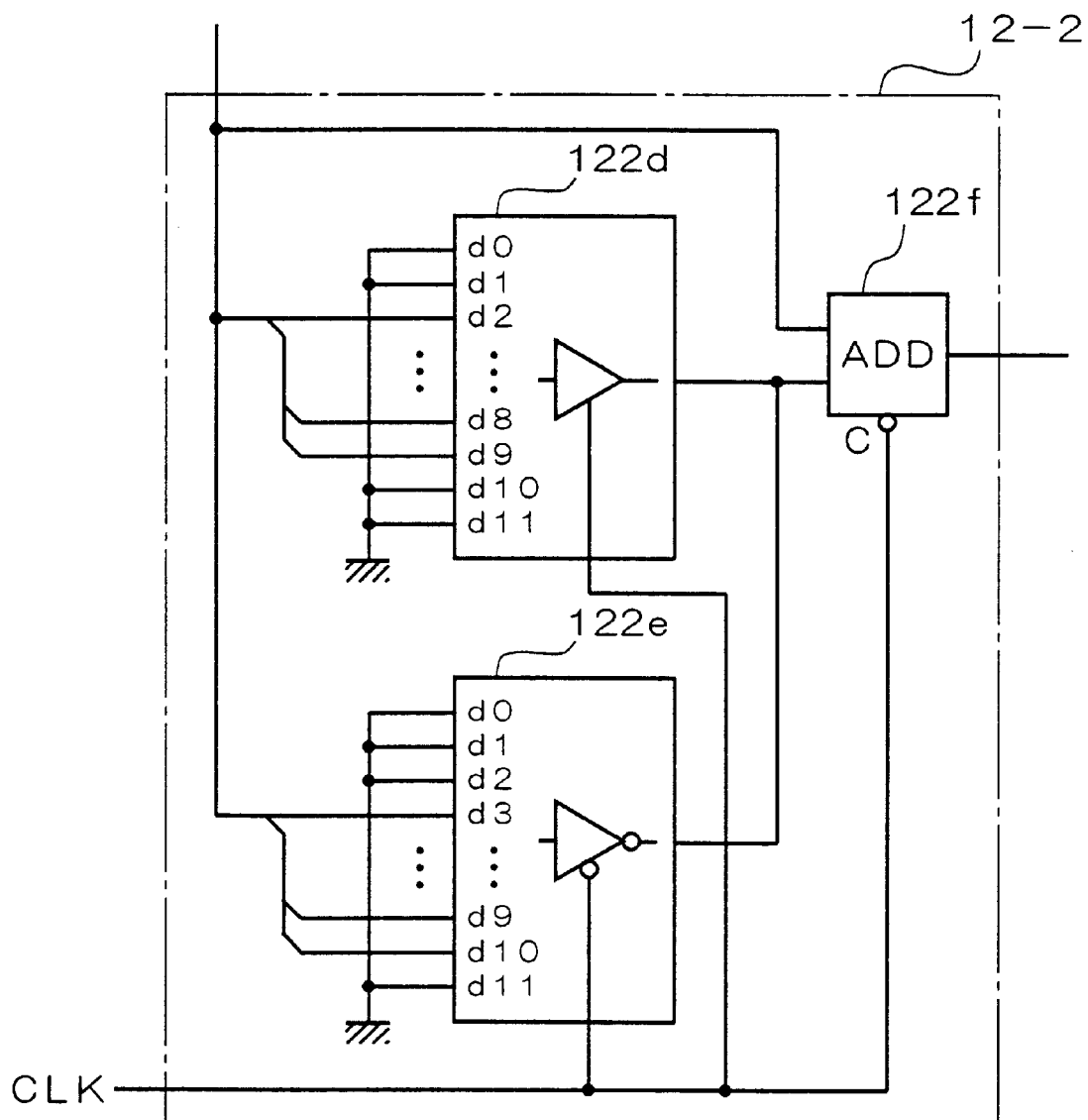
FIG. 14 is a diagram showing a detailed configuration of the multiplier.

In addition, the multiplier 12-2 comprises a tri-state buffer 122d having a non-inverting output terminal, a tri-state buffer 122e having an inverting output terminal, and an adder (ADD) 122f having two input terminals and a carry terminal C as shown in FIG. 14.

When the clock signal input to the control terminal indicates a high level (in the first half of one clock period), the tri-state buffer 122d shifts the input data to a higher bit by two bits, and outputs the shifted data, thereby performing a multiplying process by a multiplicator of +4.

When the clock signal CLK inverted and input to the control terminal indicates a low level (in the second half of one clock period), the tri-state buffer 122e shifts and outputs the input data to a higher bit by three bits, and outputs the data after inverting each bit of the shifted data, thereby performing a multiplying process by a multiplicator of −8. Actually, by obtaining a complement by adding 1 after inverting each bit, a multiplying process can be performed using a multiplicator of −8. The process of adding 1 is performed by the adder 122f at the subsequent stage.

The adder 122f adds the input data before the multiplication to the multiplication result output from any of the two tri-state buffers 122d and 122e, and further adds 1 corresponding to the carry when the clock signal CLK inverted and input to the carry terminal C indicates a low level (in the second half of one clock period). As described above, the addition of 1 corresponding to the carry is performed to obtain a complement using the tri-state buffer 122e.

Since the operation of only the tri-state buffer 122d is valid in the first half of one clock period in the multiplier 12-2 with the above mentioned configuration, the adder 122f outputs a sum (+4D+D=+5D) obtained by adding the input data D to the multiplication result (+4D) obtained by multiplying the input data D by +4. In the second half of one clock period, since the operation of only the other tri-state buffer 122e is valid, the adder 122f outputs a sum (−8D+D=−7D) obtained by adding the input data D to the multiplication result (−8D) obtained by multiplying the input data D by −8.

Thus, by performing multiplying processes using multiplicators of +5 and −7 by combining the multiplying process of the power of 2 by a bit shift with the adding process, the multiplier 12-2 can be configured only by tri-state buffers and an adder, thereby simplifying the configuration.

Figure 15:
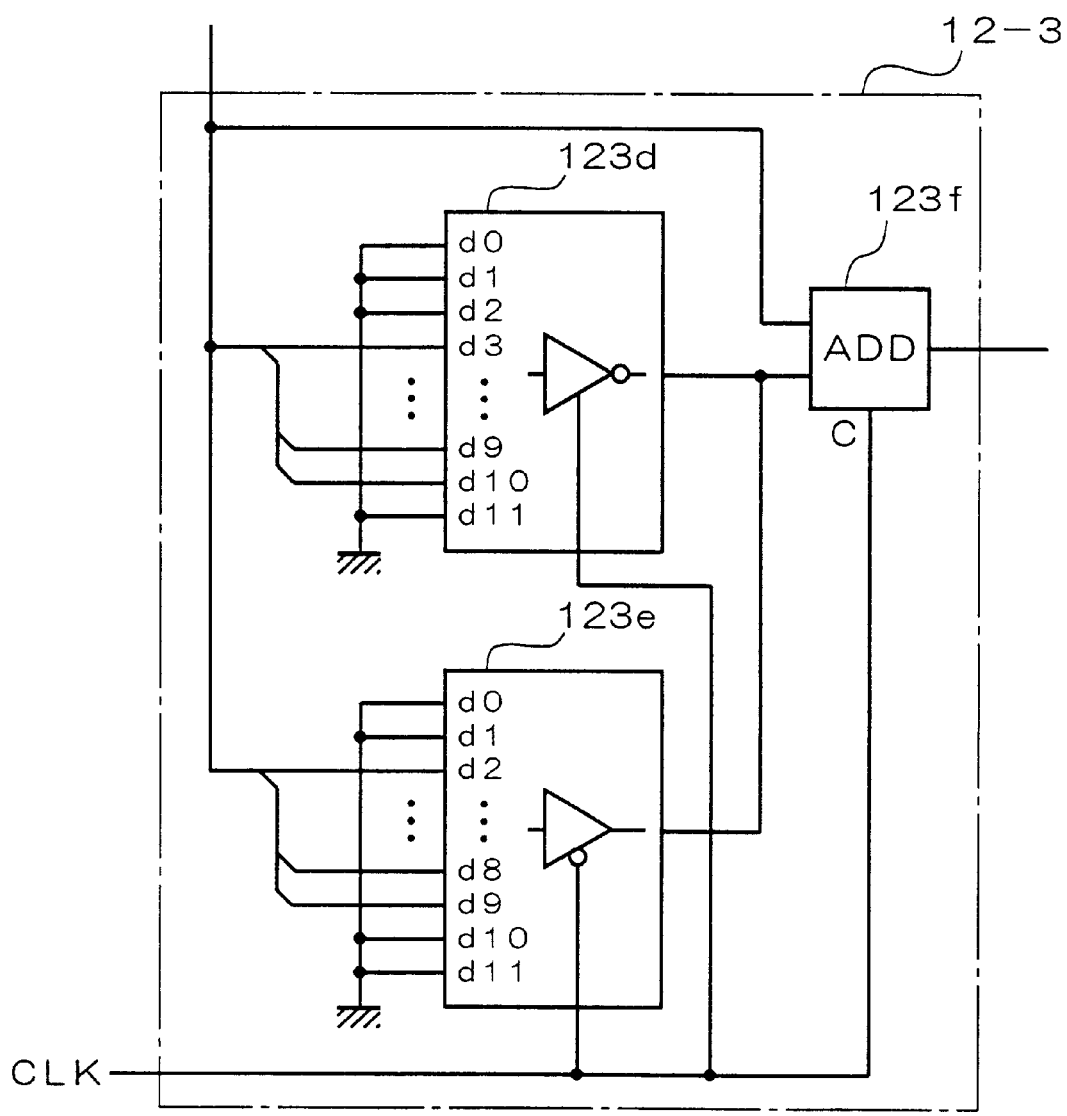
FIG. 15 is a diagram showing a detailed configuration of the multiplier.

In addition, the multiplier 12-3 comprises a tri-state buffer 123d having an inverting output terminal, a tri-state buffer 123e having a non-inverting output terminal, and an adder (ADD) 123f having two input terminals and a carry terminal C as shown in FIG. 15.

When the clock signal CLK inverted and input to the control terminal indicates a high level (in the first half of one clock period), the tri-state buffer 123d shifts and outputs the input data to a higher bit by three bits, and outputs the data after inverting each bit of the shifted data, thereby performing a multiplying process by a multiplicator of −8. Actually, by obtaining a complement by adding 1 after inverting each bit, a multiplying process can be performed using a multiplicator of −8. The process of adding 1 is performed by the adder 123f at the subsequent stage.

When the clock signal CLK inverted and input to the control terminal indicates a low-level (in the second half of one clock period), the tri-state buffer 123e shifts the input data to a higher bit by two bits, and outputs the shifted data, thereby performing a multiplying process by a multiplicator of +4.

The adder 123f adds the input data before the multiplication to the multiplication result output from any of the two tri-state buffers 123d and 123e, and further adds 1 corresponding to the carry when the clock signal CLK input to the carry terminal C indicates a high level (in the first half of one clock period). As described above, the addition of 1 corresponding to the carry is performed to obtain a complement using the tri-state buffer 123e.

Since the operation of only the tri-state buffer 123d is valid in the first half of one clock period in the multiplier 12-3 with the above mentioned configuration, the adder 123f outputs a sum (−8D+D=−7D) obtained by adding the input data D to the multiplication result (−8D) obtained by multiplying the input data D by −8. In the second half of one clock period, since the operation of only the other tri-state buffer 123e is valid, the adder 123f outputs a sum (+4D+D=+5D) obtained by adding the input data D to the multiplication result (+4D) obtained by multiplying the input data D by +4.

Thus, by performing multiplying processes using multiplicators of −7 and +5 by combining the multiplying process of the power of 2 by a bit shift with the adding process, the multiplier 12-3 can be configured only by tri-state buffers and an adder, thereby simplifying the configuration.

In addition, the multiplier 12-4-comprises a tri-state buffer 124d having a non-inverting output terminal, a tri-state buffer 124e having an inverting output terminal, and an adder (ADD) 124f having two input terminals and a carry terminal C as shown in FIG. 16.

When the clock signal input to the control terminal indicates a high level (in the first half of one clock period), the tri-state buffer 124d shifts the input data to a higher bit by one bit, and outputs the shifted data, thereby performing a multiplying process by a multiplicator of 2.

When the clock signal CLK inverted and input to the control terminal indicates a low level (in the second half of one clock period), the tri-state buffer 124e shifts the input data to a higher bit by one bit, and outputs the data after inverting each bit of the shifted data, thereby performing a multiplying process by a multiplicator of −2. Actually, by obtaining a complement by adding 1 after inverting each bit, a multiplying process can be performed using a multiplicator of −2. The process of adding 1 is performed by the adder 124f at the subsequent stage.

The adder 124f adds the input data before the multiplication to the multiplication result output from any of the two tri-state buffers 124d and 124e, and further adds 1 corresponding to the carry when the clock signal CLK inverted and input to the carry terminal C indicates a low level (in the second half of one clock period). As described above, the addition of 1 corresponding to the carry is performed to obtain a complement using the tri-state buffer 124e.

Since the operation of only the tri-state buffer 124d is valid in the first half of one clock period in the multiplier 12-4 with the above mentioned configuration, the adder 124f outputs a sum (+2D+D=+3D) obtained by adding the input data D to the multiplication result (+2D) obtained by multiplying the input data D by +2. In the second half of one clock period, since the operation of only the other tri-state buffer 124e is valid, the adder 124f outputs a sum (−2D+D=−D) obtained by adding the input data D to the multiplication result (−2D) obtained by multiplying the input data D by −2.

Thus, by performing multiplying processes using multiplicators of +3 and −1 by combining the multiplying process of the power of 2 by a bit shift with the adding process, the multiplier 12-4 can be configured only by tri-state buffers and an adder, thereby simplifying the configuration.

Figure 17:
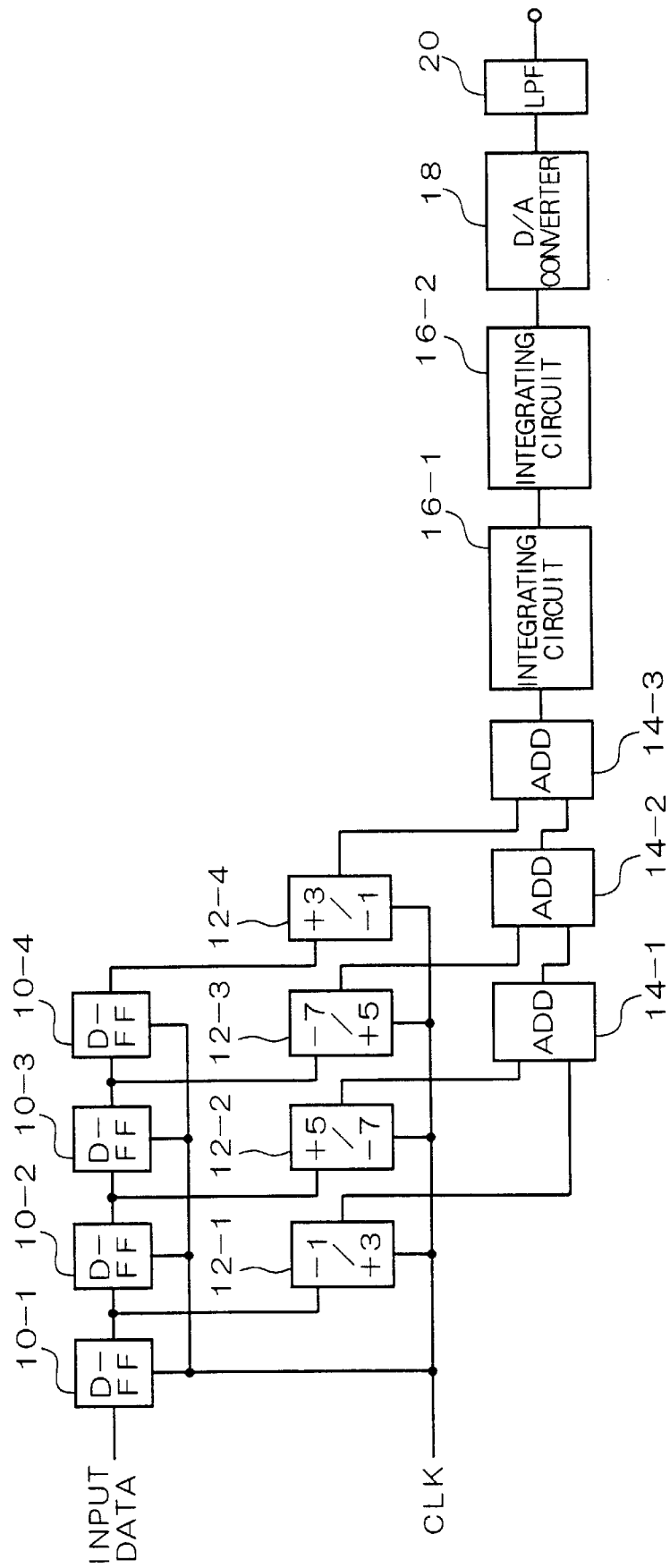
FIG. 17 is a diagram showing a configuration of the D/A converter to which the oversampling circuit shown in FIG. 5 is applied.

A D/A converter can be configured with smaller number of parts by adding a low pass filter, etc. at the subsequent stage of the above mentioned oversampling circuit. FIG. 17 shows the configuration of the D/A converter. The D/A converter has the configuration obtained by adding a D/A converter 18 and a low pass filter (LPF) 20 at the subsequent stage of the oversampling circuit shown in FIG. 5.

The D/A converter 18 generates an analog voltage corresponding to the stepwise digital data output by the integrating circuit 16-2 at the subsequent stage. The D/A converter 18 generates a constant analog voltage proportional to the value of the input digital data, and the voltage value at the output terminal of the D/A converter 18 also changes stepwise. The low pass filter 20 smoothes the output voltage of the DIA converter 18, and outputs a smoothly changing analog signal.

Since the D/A converter shown in FIG. 17 uses the oversampling circuit shown in FIG. 5, the configuration can be simplified and the cost of parts can be reduced. Although an output waveform is obtained with less distortion and the oversampling frequency set high, the configuration is not complicated. As a result, it can be realized to reduce the cost.

The present invention is not limited to the above mentioned embodiment, and various types of embodiments can be set within the scope of the gist of the present invention.

For example, according to the above mentioned embodiment, a sampling function is defined as a function of local support differentiable only once in the whole range, but the times of differentiation can be set to a value equal to or larger than 2. In this case, the number of integrating circuits is to match the number of times of differentiation.

The sampling function of this embodiment converges to zero at t=±2, as shown in FIG. 1, but may converge to zero at t=±3 or beyond. For example, in a case of the sampling function converging to zero at t=±3, six D flip-flops and six multipliers may be contained in the oversampling circuit shown in FIG. 5, to interpolate for the six digital data.

Furthermore, it is not limited to the interpolating process using a sampling function of local support, but using a sampling function differentiable finite times having a predetermined value in the range from −∞ to +∞, an interpolation process may be performed only for plural digital data corresponding to finite sample position. For example, assuming that the above mentioned sampling function is defined by a quadric piecewise polynomial, a predetermined step function waveform can be obtained by differentiating twice each piecewise polynomial, thereby operating a multiplier using each multiplicator corresponding to the step function waveform.

INDUSTRIAL APPLICABILITY

As described above, according to the present invention, output data having values smoothly changing can be obtained by adding up multiplication results for plural pieces of sequentially input digital data, and digitally integrating the addition result. Therefore, when an oversampling frequency is high, it is necessary only to speed up the digital integration, thereby avoiding the conventional complicated configuration, that is, simplifying the configuration, and reducing the cost of parts.

What is claimed is:

1. An oversampling circuit, characterized by comprising:

a plurality of data holding unit for holding each of plural pieces of digital data input at predetermined intervals;

a plurality of multiplying unit for receiving said digital data held by each of said plurality of data holding unit, and performing a multiplying process using different multiplicators between a first half and a second half of a data holding period;

an adding unit for performing a process of adding up multiplication results of said plurality of multiplying unit; and an integrating unit for performing a digital integrating process plural times on output data from said adding unit.

2. The oversampling circuit according to claim 1, characterized in that each of the multiplicators used in the multiplying processes by said plurality of multiplying unit corresponds to each of the values of step functions obtained by differentiating plural times piecewise polynomials for a predetermined sampling function configured by the piecewise polynomials.

3. The oversampling circuit according to claim 2, wherein said step function comprises a positive region and a negative region set to have an equal area.

4. The oversampling circuit according to claim 3, wherein said sampling function is differentiable only once over the whole range and has values of local support.

5. The oversampling circuit according to claim 2, characterized in that said step function consists of eight piecewise sections in equal width with a weight of −1, +3, +5, −7, −7, +5, +3, and −1 in a predetermined range corresponding to said five digital data arranged at an equal interval, and that every two of the eight weight coefficients are set as the multiplicators in each of said plurality of multiplying unit.

6. The oversampling circuit according to claim 5, characterized in that a multiplying process performed in each of said plurality of multiplying unit is realized by adding said digital data to an operation result of an exponentiation of 2 by a bit shift.

7. The oversampling circuit according to claim 1, characterized in that times of said digital integration is two, and data whose value changes like a quadric function is output from said integrating unit.

8. The oversampling circuit according to claim 1, characterized in that said digital integration performed by said integrating unit is an operating process of accumulating input data, and n times of an oversampling process is performed by repeatedly performing the operating process n times in one period of inputting the digital data to said data holding unit.

9. A digital-to-analog converter, comprising at a stage subsequent to said oversampling circuit according to claim 1:

voltage generation unit for generating an analog voltage corresponding to a value of data output by said integrating unit; and smoothing unit for smoothing the analog voltage generated by said voltage generation unit.

* * * * *